United States Patent
Araki

(10) Patent No.: US 6,714,060 B2
(45) Date of Patent: Mar. 30, 2004

(54) MASTER SLAVE FLIP-FLOP CIRCUIT FUNCTIONING AS EDGE TRIGGER FLIP-FLOP

(75) Inventor: Masahiro Araki, Hyogo (JP)

(73) Assignees: Renesas Technology Corp., Tokyo (JP); Mitsubishi Electric System LSI Design Corporation, Itami (JP)

(*) Notice: Subject to any disclaimer, the term of this patent is extended or adjusted under 35 U.S.C. 154(b) by 0 days.

(21) Appl. No.: 10/358,157

(22) Filed: Feb. 5, 2003

(65) Prior Publication Data

US 2004/0027184 A1 Feb. 12, 2004

(30) Foreign Application Priority Data

Aug. 6, 2002 (JP) .................................... 2002-229127

(51) Int. Cl.[7] .............................................. H03K 3/289
(52) U.S. Cl. ...................... 327/202; 327/203; 327/544
(58) Field of Search ................................ 327/202, 203, 327/204, 215, 217, 225, 218, 212, 544

(56) References Cited

U.S. PATENT DOCUMENTS 4,779,009 A * 10/1988 Tsunoi et al. ............... 327/202
5,001,361 A * 3/1991 Tamamura et al. .......... 327/202
5,155,383 A * 10/1992 Barbera ....................... 327/198
6,624,677 B1 * 9/2003 Wissel ......................... 327/202

FOREIGN PATENT DOCUMENTS

| JP | 09-232920 | 9/1997 |
| JP | 09-294056 | 11/1997 |
| JP | 2001-127595 | 5/2001 |

* cited by examiner

Primary Examiner—Tuan T. Lam
Assistant Examiner—Hiep Nguyen
(74) Attorney, Agent, or Firm—Burns, Doane, Swecker & Mathis, L.L.P.

(57) ABSTRACT

In a master latch circuit, input data signal is received in a data through state and is held in a data holding state as output data signal. In a slave latch circuit, the output data signal is received in a data through state and is held and output in a data holding state. In a circuit setting control unit, in response to a clock signal, the disconnection of a first line from a power source and the connection of a second line to a ground terminal in an NMOS transistor are performed to set the master latch circuit and the slave latch circuit to the data through state and the data holding state respectively, and the connection of the first line and the disconnection of the second line are performed to change the states of the latch circuits.

8 Claims, 6 Drawing Sheets

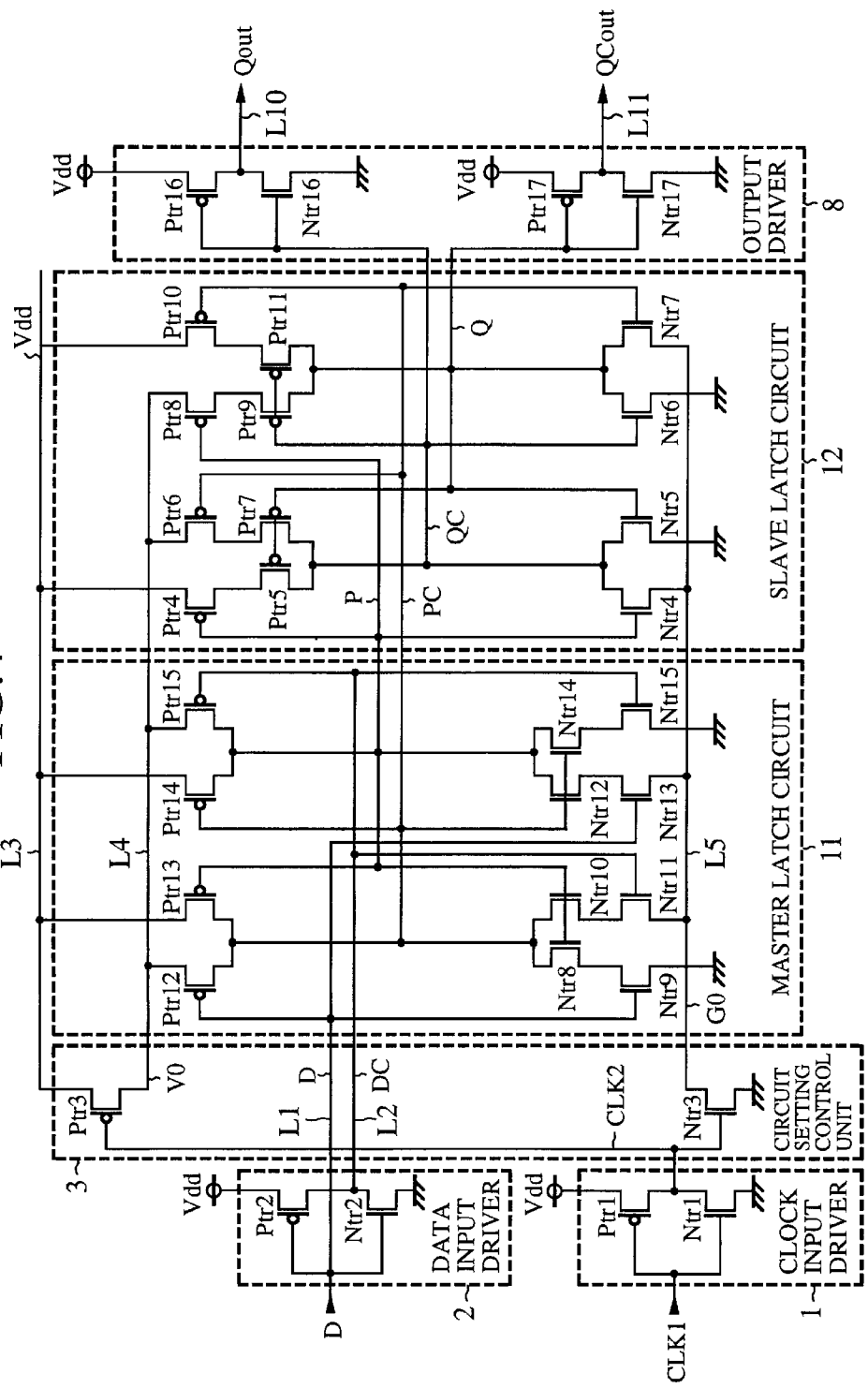

MASTER SLAVE FLIP-FLOP CIRCUIT FUNCTIONING AS EDGE TRIGGER FLIP-FLOP

BACKGROUND OF THE INVENTION

1. Field of the Invention

The present invention relates to a master slave flip-flop circuit in which consumed electric power is reduced.

2. Description of Related Art

FIG. 7 is a constitutional view of a conventional master slave flip-flop circuit. In FIG. 7, 21 indicates a clock input driver for receiving a clock signal CLK, outputting a positive phase clock signal T having the same phase as that of the clock signal CLK and outputting an inverted phase clock signal TC having a phase opposite to that of the clock signal CLK. 22 indicates a master latch circuit set to a data though state in response to the low level of the clock signal CLK and set to a data holding state in response to the high level of the clock signal CLK to load a new value of a data signal D in each data though state and to hold the new value in the data holding state set just after the data though state. 23 indicates a slave latch circuit set to a data though state in response to the high level of the clock signal CLK and set to a data holding state in response to the low level of the clock signal CLK to load the new value held in the master latch circuit 22 of the data holding state in each data though state and to hold the new value as a preceding value in the data holding state set just after the data through state. 24 indicates an output driver for inverting and outputting the preceding value held in the slave latch circuit 23.

The clock input driver 21 has both a first inverter and a second inverter. The first inverter is composed of a p-channel metal oxide semiconductor (PMOS) transistor 21a and an n-channel metal oxide semiconductor (NMOS) transistor 21b connected to each other at a drain connection terminal. The second inverter is composed of PMOS transistor 21c and an NMOS transistor 21d connected to each other at a drain connection terminal. The inverted phase clock signal TC is output from the drain connection terminal of the first inverter, and the positive phase clock signal T is output from the drain connection terminal of the second inverter.

The master latch circuit 22 has a switching element 22a, a switching element 22b, a third inverter composed of a PMOS transistor 22c and an NMOS transistor 22d and a fourth inverter composed of a PMOS transistor 22e and an NMOS transistor 22f. The switching element 22a and the third and fourth inverters are serially connected to each other in that order, and the switching element 22b is connected in parallel to the third and fourth inverters. A data signal D is input to the switching element 22a, and the value of the data signal D held in the master latch circuit 22 is output from a drain connection terminal of the fourth inverter.

The slave latch circuit 23 has a switching element 23a, a switching element 23b, a fifth inverter composed of a PMOS transistor 23c and an NMOS transistor 23d and a sixth inverter composed of a PMOS transistor 23e and an NMOS transistor 23f. The switching element 23a and the fifth and sixth inverters are serially connected to each other in that order, and the switching element 23b is connected in parallel to the fifth and sixth inverters. The value held in the master latch circuit 22 is input to the switching element 23a, an inverted output signal QC having a phase opposite to that of the data signal D is output from a drain connection terminal of the fifth inverter, and a positive output signal Q having the same phase as that of the data signal D is output from a drain connection terminal of the sixth inverter.

The output driver 24 has both a seventh inverter composed of a PMOS transistor 24a and an NMOS transistor 24b and an eighth inverter composed of a PMOS transistor 24c and an NMOS transistor 24d. The seventh and eighth inverters are connected in parallel to each other. The inverted output signal QC of the slave latch circuit 23 is input to the seventh inverter, and a positive phase output data signal Qout having the same phase as that of the data signal D is output from a drain connection terminal of the seventh inverter. Also, the positive output signal Q of the slave latch circuit 23 is input to the eighth inverter, and an inverted phase output data signal QCout having a phase opposite to that of the data signal D is output from a drain connection terminal of the eighth inverter.

Each of the switching elements 22a, 22b, 23a and 23b is composed of a PMOS transistor and an NMOS transistor, and an on state and an off state are alternately set in the switching element in response to the level changes of both the positive phase clock signal T and the inverted phase clock signal TC. The timing of the on and off states in the switching element 22a is the same as that in the switching element 23b, and the timing of the on and off states in the switching element 22b is the same as that in the switching element 23a. The on and off states of each switching element are set in correspondence to the high and low levels of the clock signal CLK.

For example, when the clock signal CLK set to the high level is changed to the low level, the positive phase clock signal T is set to the low level, and the inverted phase clock signal TC is set to the high level. Each of the switching elements 22a and 23b is set to the on state according to the clock signals T and TC, and each of the switching elements 22b and 23a is set to the off state according to the clock signals T and TC. In this case, the master latch circuit 22 is set to the data through state, and the data signal D passes through the switching element 22a and is input to the third and fourth inverters composed of the PMOS transistors 22c and 22e and the NMOS transistors 22d and 22f. Therefore, a new value of the data signal D is loaded in the master latch circuit 22. At this time, in the slave latch circuit 23, the switching circuit 23a is set to the off state, and the switching circuit 23b is set to the on state. Therefore, the slave latch circuit 23 is set to the data holding state so as to hold a preceding value which is received in the data through state just before the data holding state. The preceding value is output to the output driver 24 as the positive output signal Q, and an inverted value of the preceding value is output to the output driver 24 as the inverted output signal QC.

In contrast, when the clock signal CLK is set to the high level, the positive phase clock signal T is set to the high level, and the inverted phase clock signal TC is set to the low level. Each of the switching elements 22a and 23b is set to the off state according to the clock signals T and TC, and each of the switching elements 22b and 23a is set to the on state according to the clock signals T and TC. In this case, the master latch circuit 22 is set to the data holding state so as to hold the new value which is received in the data through state set just before the data holding state, and the slave latch circuit 23 is set to the data through state to receive the new value held in the master latch circuit 22.

Therefore, the data through state and the data holding state are alternately set in the master latch circuit 22 in response to the clock signal CLK, the data holding state and the data through state different from the state of the master latch circuit 22 are alternately set in the slave latch circuit 23 in response to the clock signal CLK, and the positive phase output data signal Qout and the inverted phase data signal Qcout are output from the output driver 24.

However, because the conventional master slave flip-flop circuit has the above-described configuration, twelve transistors composed of the PMOS transistor 21a, the NMOS transistor 21b, the PMOS transistor 21c, the NMOS transistor 21d, the four PMOS transistors of the switching elements 22a, 22b, 23a and 23b and the four NMOS transistors of the switching elements 22a, 22b, 23a and 23b are operated in response to the clock signal CLK. In this case, both a charging current and a discharging current depending on parasitic capacitance (or gate capacitance) based on the gate electrode of each transistor flows through the gate electrode of the transistor each time the transistor is turned on or off in response to the clock signal, and electric power is consumed in the twelve transistors. Therefore, a problem has arisen that it is difficult to reduce electric power consumed in a semiconductor integrated circuit including the conventional master slave flip-flop circuit.

SUMMARY OF THE INVENTION

An object of the present invention is to provide, with due consideration to the drawbacks of the conventional master slave flip-flop circuit, a master slave flip-flop circuit in which consumed electric power is reduced.

The object is achieved by the provision of a master slave flip-flop circuit including a master latch circuit, a slave latch circuit and circuit state setting control means. The disconnection of a first line from a line set to a first electric potential and the connection of a second line to a line set to a second electric potential is performed by the circuit state setting control means in response to a first level of a clock signal to set the master latch circuit to a data through state and to set the slave latch circuit to a data holding state. The connection of the first line to the line set to the first electric potential and the disconnection of the second line from the line set to the second electric potential is performed by the circuit state setting control means in response to a second level of the clock signal to set the master latch circuit to the data holding state and to set the slave latch circuit to the data through state. In the master latch circuit, input data is received in the data through state and is held as master output data in the data holding state. In the slave latch circuit, the master output data is received in the data through state and is held as slave output data in the data holding state. The slave output data is output from the slave latch circuit.

Accordingly, because only the circuit state setting control means is operated in response to the clock signal to merely perform the connection and disconnection of the first and second lines, the number of transistors operated in synchronization with the clock signal can be considerably reduced, an amount of both a charging current and a discharging current depending on parasitic capacitance based on gate electrodes of the transistors can be considerably reduced, and the electric power consumed in the master slave flip-flop circuit can be considerably reduced.

BRIEF DESCRIPTION OF THE DRAWINGS

FIG. 4 is a constitutional view of a master slave flip-flop circuit according to a second embodiment of the present invention;

DETAILED DESCRIPTION OF THE PREFERRED EMBODIMENTS

Embodiments of the present invention will now be described with reference to the accompanying drawings.

Embodiment 1

In cases where a master slave flip-flop circuit is formed of transistors operated in synchronization with a clock signal and transistors operated in synchronization with an input data signal, the transistors operated in synchronization with the clock signal are frequently turned on and off so as to consume electric power. In contrast, the level change of the input data signal is not frequently performed. Therefore, even though the number of transistors operated in synchronization with the input data signal is large, electric power consumed in the transistors operated in synchronization with the input data signal is low as compared with that consumed in the transistors operated in synchronization with the clock signal. For example, a level change ratio of the clock signal to the input data signal is almost equal to 10:1, and a consumed electric power of one transistor operated in synchronization with the clock signal is almost the same as that of ten transistors operated in synchronization with the input data signal. Therefore, in both first and second embodiments, the number of transistors operated in synchronization with the clock signal is reduced.

Figure 1:
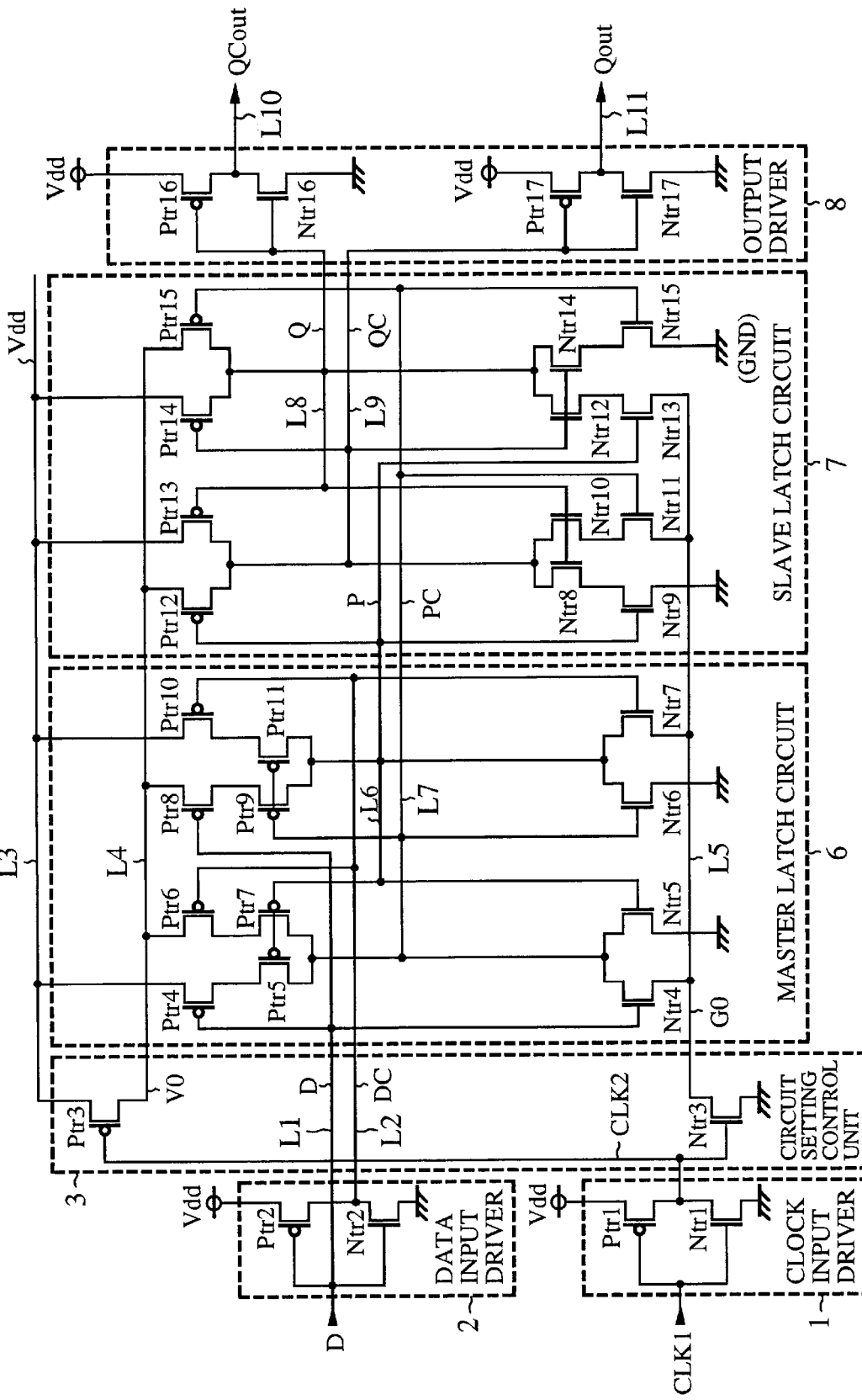
FIG. 1 is a constitutional view of a master slave flip-flop circuit according to a first embodiment of the present invention.

FIG. 1 is a constitutional view of a master slave flip-flop circuit according to a first embodiment of the present invention.

In FIG. 1, 1 indicates a clock input driver having an inverter formed of both a p-channel metal oxide semiconductor (PMOS) transistor Ptr1 and an n-channel metal oxide semiconductor (NMOS) transistor Ntr1. Drains of both the PMOS transistor Ptr1 and the NMOS transistor Ntr1 are connected to each other. A source of the PMOS transistor Ptr1 is connected to a power source Vdd. A source of the NMOS transistor Ntr1 is connected to the ground terminal GND set to a ground electric potential (second electric potential or first electric potential). In the clock input driver 1, an input clock signal (or a clock signal) CLK1 is input to the gates of both the PMOS transistor Ptr1 and the NMOS transistor Ntr1, a phase of the input clock signal CLK1 is inverted to obtain an inverted phase clock signal CLK2 having a shaped waveform, and the inverted phase clock signal CLK2 is output from a connection terminal of the drains.

2 indicates a data input driver having an inverter formed of both a PMOS transistor Ptr2 and an NMOS transistor Ntr2. Drains of both the PMOS transistor Ptr2 and the NMOS transistor Ntr2 are connected to each other. A source of the PMOS transistor Ptr2 is connected to the power source Vdd. A source of the NMOS transistor Ntr2 is connected to the ground terminal GND. The positive phase input data signal D is output from the data input driver 2 to a line L1. Also, a positive phase input data signal D is input to the gates of both the PMOS transistor Ptr2 and the NMOS transistor Ntr2, and an inverted phase input data signal DC having a phase obtained by inverting a phase of the data signal D is output from a connection point of the drains to a line L2.

3 indicates a circuit setting control unit (or circuit state setting control means) having a PMOS transistor Ptr3 and an NMOS transistor Ntr3. A source of the PMOS transistor Ptr3 is connected to a line L3 of a power source Vdd, a drain of the PMOS transistor Ptr3 is connected to a first line (V0) 4, a source of the NMOS transistor Ntr3 is connected to a ground terminal GND, a drain of the NMOS transistor Ntr3 is connected to a second line (G0) 5, and the inverted phase clock signal CLK2 of the clock input driver 1 is input to gates of both the PMOS transistor Ptr3 and the NMOS transistor Ntr3. In the circuit setting control unit 3, a current flowing from the line L3 of the power source Vdd to the first circuit state setting line L4 is controlled by disconnecting or connecting the first circuit state setting line L4 from/to the line L3 in the PMOS transistor Ptr3 according to the inverted phase clock signal CLK2, and a current flowing from the second circuit state setting line L5 to the ground terminal GND is controlled by connecting or disconnecting the second circuit state setting line L5 to/from the ground terminal GND in the NMOS transistor Ntr3 according to the inverted phase clock signal CLK2.

6 indicates a master latch circuit having PMOS transistors Ptr4 to Ptr11 and NMOS transistors Ntr4 to Ntr7. Sources of the PMOS transistors Ptr4 and Ptr10 are connected to the line L3 of the power source Vdd. Sources of the PMOS transistors Ptr6 and Ptr8 are connected to the first circuit state setting line L4. Drains of the PMOS transistors Ptr4, Ptr6, Ptr8 and Ptr10 are connected to sources of the PMOS transistors Ptr5, Ptr7, Ptr9 and Ptr11 respectively. Sources of the NMOS transistors Ntr4 and Ntr7 are connected to the second circuit state setting line L5. Sources of the NMOS transistors Ntr5 and Ntr6 are connected to the ground terminal GND. Drains of the PMOS transistors Ptr9 and Ptr11, drains of the NMOS transistors Ntr6 and Ntr7, a gate of the NMOS transistor Ntr5 and gates of the PMOS transistors Ptr5 and Ptr7 are connected to a line L6. Drains of the PMOS transistors Ptr5 and Ptr7, drains of the NMOS transistors Ntr4 and Ntr5, a gate of the NMOS transistor Ntr6 and gates of the PMOS transistors Ptr9 and Ptr11 are connected to a line L7. A gate of the NMOS transistor Ntr4 and gates of the PMOS transistors Ptr4 and Ptr8 are connected to the line L1. A gate of the NMOS transistor Ntr7 and gates of the PMOS transistors Ptr6 and Ptr10 are connected to the line L2. The master latch circuit 6 is set to a data through state or a data holding state according to levels of the first circuit state setting line 4 and the second circuit state setting line 5 set by the circuit setting control unit 3. The data through state and the data holding state are alternately changed. In the master latch circuit 6, a positive phase master output data signal P output to the line L6 and an inverted phase master output data signal PC output to the line L7 are obtained in response to the positive phase input data signal D sent through the line L1 and the inverted phase input data signal DC sent through the line L2.

7 indicates a slave latch circuit having PMOS transistors Ptr12 to Ptr15 and NMOS transistors Ntr8 to Ntr15. Sources of the PMOS transistors Ptr13 and Ptr14 are connected to the line L3 of the power source Vdd. Sources of the PMOS transistors Ptr12 and Ptr15 are connected to the first circuit state setting line L4. Sources of the NMOS transistors Ntr11 and Ntr13 are connected to the second circuit state setting line L5. Sources of the NMOS transistors Ntr9 and Ntr15 are connected to the ground terminal GND. A drain of the NMOS transistor Ntr9 is connected to a source of the NMOS transistor Ntr8. A drain of the NMOS transistor Ntr11 is connected to a source of the NMOS transistor Ntr10. A drain of the NMOS transistor Ntr13 is connected to a source of the NMOS transistor Ntr12. A drain of the NMOS transistor Ntr15 is connected to a source of the NMOS transistor Ntr14. Drains of the PMOS transistors Ptr14 and Ptr15, drains of the NMOS transistors Ntr12 and Ntr14, a gate of the PMOS transistor Ptr13 and gates of the NMOS transistors Ntr8 and Ntr10 are connected to the line L8. Drains of the PMOS transistors Ptr12 and Ptr13, drains of the NMOS transistors Ntr8 and Ntr10, a gate of the PMOS transistor Ptr14 and gates of the NMOS transistors Ntr12 and Ntr14 are connected to the line L9. A gate of the PMOS transistor Ptr12 and gates of the NMOS transistors Ntr9 and Ntr13 are connected to the line L6. A gate of the PMOS transistor Ptr15 and gates of the NMOS transistors Ntr11 and Ntr15 are connected to the line L7. The slave latch circuit 7 is set to a data through state or a data holding state according to levels of both the first circuit state setting line 4 and the second circuit state setting line 5 set by the circuit setting control unit 3. The data through state and the data holding state are alternately changed. In the slave latch circuit 7, a positive phase slave output data signal Q output to the line L8 and an inverted phase slave output data signal QC output to the line L9 are obtained in response to the positive phase master output data signal P sent through the line L6 and the inverted phase master output data signal PC sent through the line L7.

8 indicates an output driver having both a first output inverter and a second output inverter. The first output inverter is formed of both a PMOS transistor Ptr16 and an NMOS transistor Ntr16. Drains of both the PMOS transistor Ptr16 and the NMOS transistor Ntr16 are connected to a line L10. A source of the PMOS transistor Ptr16 is connected to the power source Vdd. A source of the NMOS transistor Ntr16 is connected to the ground terminal GND. Gates of both the PMOS transistor Ptr16 and the NMOS transistor Ntr16 are connected to the line L8. The second output inverter is formed of both a PMOS transistor Ptr17 and an NMOS transistor Ntr17. Drains of both the PMOS transistor Ptr17 and the NMOS transistor Ntr17 are connected to a line L11. A source of the PMOS transistor Ptr17 is connected to the power source Vdd. A source of the NMOS transistor Ntr17 is connected to the ground terminal GND. Gates of both the PMOS transistor Ptr17 and the NMOS transistor Ntr17 are connected to the line L9. In the output driver 8, a positive phase output data signal Qout having a phase opposite to that of the inverted phase slave output data signal QC is output to the line L11 in response to the inverted phase slave output data signal QC sent through the line L9, and an inverted phase output data signal QCout having a phase opposite to that of the positive phase slave output data signal Q is output to the line L10 in response to the positive phase slave output data signal Q sent through the line L8.

In the master slave flip-flop circuit, the transistors Ptr1 and Ntr1 of the clock input driver 1 and the transistors Ptr3 and Ntr3 of the circuit setting control unit 3 are operated in synchronization with the leading and trailing edges of the clock signal CLK1.

Figure 2A:
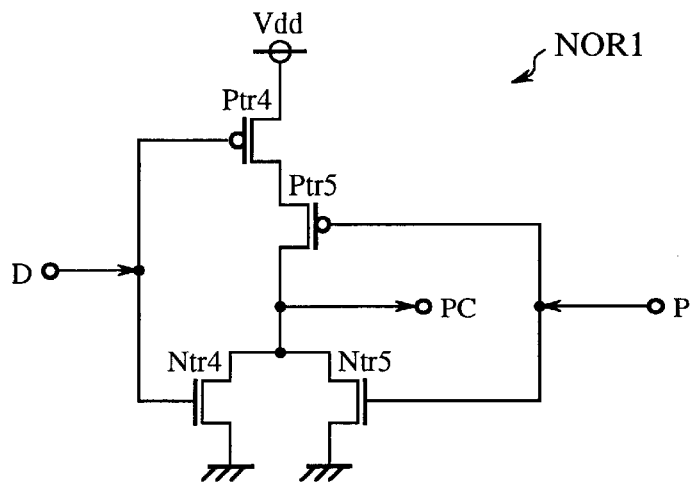
FIG. 2A is a circuit view of an NOR gate denoting a half portion of a master latch circuit of the master slave flip-flop circuit shown in FIG. 1 in case of a clock signal CLK1 set to the low level.
Figure 2B:
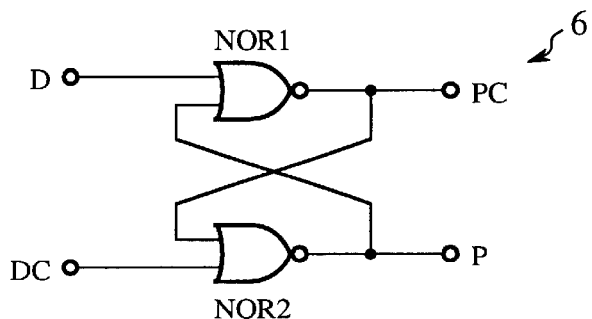
FIG. 2B is a gate view of a RS flip-flop equivalent to the master latch circuit in case of the clock signal CLK1 set to the low level.
Figure 2C:
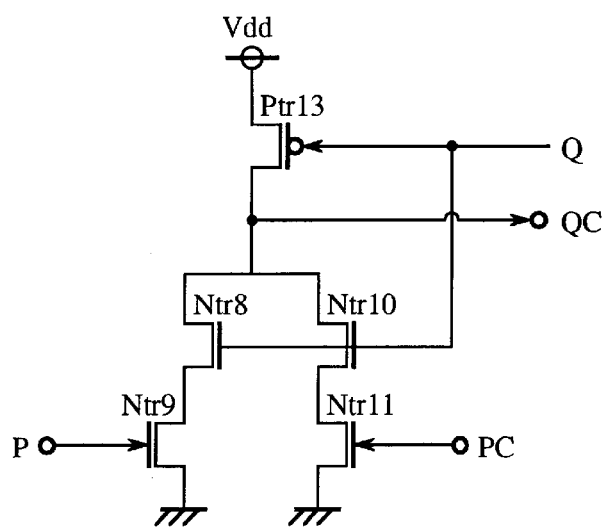
FIG. 2C is a circuit view of a half portion of a slave latch circuit of the master slave flip-flop circuit shown in FIG. 1 in case of the clock signal CLK1 set to the low level.
Figure 3A:
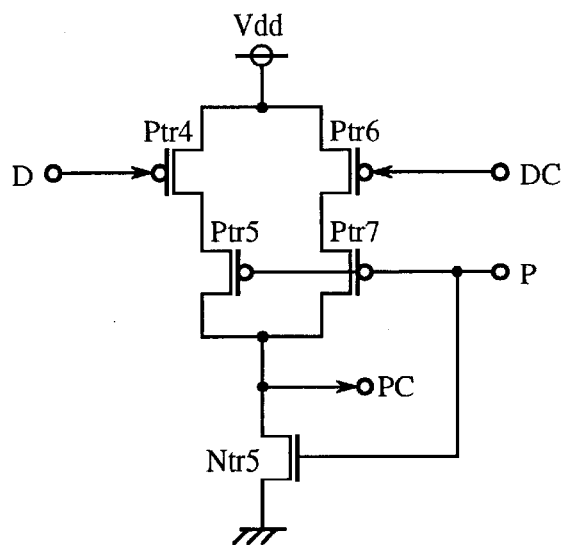
FIG. 3A is a circuit view of a half portion of the master latch circuit in case of the clock signal CLK1 set to the high level.
Figure 3B:
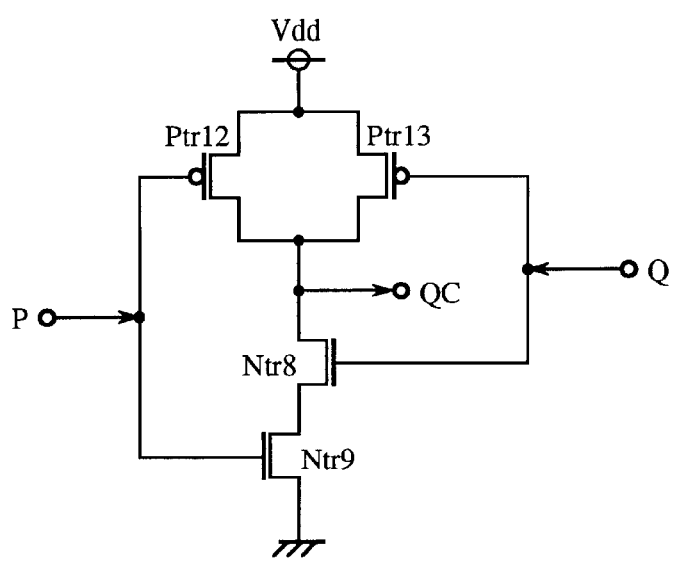
FIG. 3B is a circuit view of an NAND gate denoting a half portion of the slave latch circuit in case of the clock signal CLK1 set to the high level.
Figure 3C:
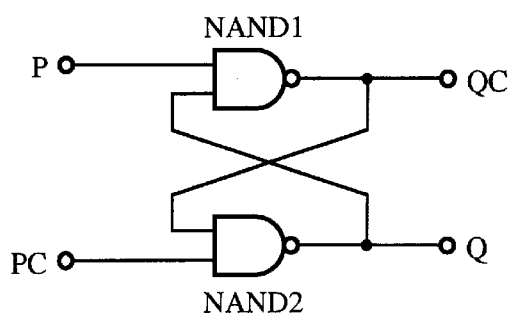
FIG. 3C is a gate view of a RS flip-flop equivalent to the slave latch circuit shown in FIG. 1 in case of the clock signal CLK1 set to the high level.

FIG. 2A is a circuit view of a half portion of the master latch circuit 6 in case of the clock signal CLK1 set to the low level. FIG. 2B is a gate view of a RS flip-flop equivalent to the master latch circuit 6 in case of the clock signal CLK1 set to the low level. FIG. 2C is a circuit view of a half portion of the slave latch circuit 7 in case of the clock signal CLK1 set to the low level. FIG. 3A is a circuit view of a half portion of the master latch circuit 6 in case of the clock signal CLK1 set to the high level. FIG. 3B is a circuit view of a half portion of the slave latch circuit 7 in case of the clock signal CLK1 set to the high level. FIG. 3C is a gate view of a RS flip-flop equivalent to the slave latch circuit 7 in case of the clock signal CLK1 set to the high level.

Next, an operation of the master slave flip-flop circuit will be described below.

In the master slave flip-flop circuit having both the master latch circuit 6 and the slave latch circuit 7, when the master latch circuit 6 is set in the data through state, the slave latch circuit 7 is set in the data holding state. When the master latch circuit 6 is set in the data holding state, the slave latch circuit 7 is set in the data through state. The data through state and the data holding state are alternately set in each of both the master latch circuit 6 and the slave latch circuit 7 in synchronization with the leading and trailing edges of the clock signal CLK1.

As shown in FIG. 1, the inverted phase clock signal CLK2 is produced from the input clock signal CLK1 in the clock input driver 1, and the inverted phase clock signal CLK2 is input to the circuit setting control unit 3.

In the circuit setting control unit 3, the levels of both the first circuit state setting line L4 and the second circuit state setting line L5 are changed according to the inverted phase clock signal CLK2 to alternately set the master latch circuit 6 to the data through state and the data holding state and to alternately set the slave latch circuit 7 to the data holding state and the data through state.

In detail, in cases where the clock signal CLK1 set to the high level is changed to the low level at a trailing edge, the inverted phase clock signal CLK2 set to the high level is output from the clock input driver 1 to the circuit setting control unit 3. In the circuit setting control unit 3, the PMOS transistor Ptr3 is turned off by the inverted phase clock signal CLK2, and the NMOS transistor Ntr3 is turned on by the inverted phase clock signal CLK2. In this case, the first circuit state setting line 4 is electrically disconnected from the line L3 of the power source Vdd, and the second circuit state setting line L5 is electrically connected to the ground terminal GND. Therefore, because no voltage is applied to each of the PMOS transistors Ptr6, Ptr7, Ptr8, Ptr9, Ptr12 and Ptr15, each PMOS transistor has a high impedance. Also, the NMOS transistors Ntr4, Ntr7, Ntr11 and Ntr13 are grounded in the same manner as the NMOS transistors Ntr5, Ntr6, Ntr9 and Ntr15.

Therefore, as shown in FIG. 2A, an NOR gate (or a first NOR gate) NOR1 having the transistors Ptr4, Ptr5, Ntr4 and Ntr5 is formed in the master latch circuit 6. Also, an NOR gate (or a second NOR gate) NOR2 having the transistors Ptr10, Ptr11, Ntr6 and Ntr7 is formed in the master latch circuit 6. In this case, an output of the NOR gate NOR1 is input to the NOR gate NOR2, and an output of the NOR gate NOR2 is input to the NOR gate NOR1. Therefore, as shown in FIG. 2B, a RS flip-flop having both the NOR gate NOR1 and the NOR gate NOR2 is formed in the master latch circuit 6. In the RS flip-flop, the positive phase input data signal D sent from the data input driver 2 through the line L1 is input to the gates of the transistors Ptr4 and Ntr4 of the NOR gate NOR1 (refer to FIG. 2A), and the inverted phase input data signal DC sent from the data input driver 2 through the line L2 is input to the gates of the transistors Ptr10 and Ntr7 of the NOR gate NOR2. Also, an inverted phase master output data signal PC is output from a drain connection point of the transistors Ptr5, Ntr4 and Ntr5 of the NOR gate NOR1 to the line L7 (refer to FIG. 2A), and a positive phase master output data signal P is output from a drain connection point of the transistors Ptr11, Ntr6 and Ntr7 of the NOR gate NOR2 to the line L6. Also, the positive phase master output data signal P is fed back to the gates of the transistors Ptr5 and Ntr5 (refer to FIG. 2A), and the inverted phase master output data signal PC is fed back to the gates of the transistors Ptr11 and Ntr6.

For example, when the positive phase input data signal D set to the low level is changed to the high level, the inverted phase input data signal DC is set to the low level. Therefore, in the NOR gate NOR1 shown in FIG. 2A, the NMOS transistor Ntr4 is turned on, the PMOS transistor Ptr4 is turned off, and the inverted phase master output data signal PC set to the low level is output from the NOR gate NOR1 to the line L7. In the NOR gate NOR2, because of the inverted phase input data signal DC and the inverted phase master output data signal PC, the PMOS transistors Ptr10 and Ptr11 are turned on, and the NMOS transistors Ntr6 and Ntr7 are turned off. Therefore, the positive phase master output data signal P set to the high level is output from the NOR gate NOR2 to the line L6. Also, though the PMOS transistor Ptr9 is turned on due to the inverted phase master output data signal PC set to the low level in addition to the PMOS transistors Ptr10 and Ptr11, because the PMOS transistor Ptr8 is turned off due to the positive phase input data signal D set to the high level, the PMOS transistor Ptr8 prevents that an electric potential (first electric potential or second electric potential) of the power source Vdd is applied to the first circuit state setting line L4 through the PMOS transistors Ptr10, Ptr11, Ptr9 and Ptr8, and it is prevented that the power source electric potential Vdd is applied to the slave latch circuit 7. Therefore, the PMOS transistor Ptr8 functions as power source electric potential preventing means.

As a result, the positive phase master output data signal P set to the high level and the inverted phase master output data signal PC set to the low level are output to the slave latch circuit 7 in response to the positive phase input data signal D set to the high level.

Also, when the positive phase input data signal D set to the high level is changed to the low level, the inverted phase input data signal DC set to the low level is changed to the high level. Therefore, in the NOR gate NOR2, the NMOS transistor Ntr7 is turned on, the PMOS transistor Ptr10 is turned off, and the positive phase master output data signal P set to the low level is output from the NOR gate NOR2 to the line L6. In the NOR gate NOR1 shown in FIG. 2A, because of both the positive phase input data signal D set to the low level and the positive phase master output data signal P set to the low level, the PMOS transistors Ptr4 and Ptr5 are turned on, and the NMOS transistors Ntr4 and Ntr5 are turned off. Therefore, the inverted phase master output data signal PC set to the high level is output from the NOR gate NOR1 to the line L7. Also, though the PMOS transistor Ptr7 is turned on due to the positive phase master output data signal P set to the low level in addition to the PMOS transistors Ptr4 and Ptr5, because the PMOS transistor Ptr6 is turned off due to the inverted phase input data signal DC set to the high level, the PMOS transistor Ptr6 prevents that an electric potential of the power source Vdd is applied to the first circuit state setting line L4 through the PMOS transistors Ptr4, Ptr5, Ptr6 and Ptr7, and it is prevented that the slave latch circuit 7 receives the power source electric potential Vdd. Therefore, the PMOS transistor Ptr6 functions as power source electric potential preventing means.

As a result, the positive phase master output data signal P set to the low level and the inverted phase master output data signal PC set to the high level are output to the slave latch circuit 7 in response to the positive phase input data signal D set to the low level.

Therefore, when the clock signal CLK1 set to the high level is changed to the low level, both the positive phase input data signal D and the inverted phase input data signal DC are received in the master latch circuit 6 equivalent to the RS flip-flop, a data through operation is performed for the positive phase input data signal D and the inverted phase input data signal DC, the positive phase master output data signal P having the same phase as that of the positive phase input data signal D is set in the line L6 of the master latch circuit 6, and the inverted phase master output data signal PC having the same phase as that of the inverted phase input data signal DC is set in the line L7 of the master latch circuit 6. That is, the master latch circuit 6 is set to the data through state.

In contrast, as shown in FIG. 2C, an inverter (or a third inverter) having the transistors Ptr13, Ntr8, Ntr9, Ntr10 and Ntr11 is formed in the slave latch circuit 7. Also, an inverter (or a fourth inverter) (not shown) having the transistors Ptr14, Ntr12, Ntr13, Ntr14 and Ntr15 is formed in the slave latch circuit 7. In the inverter shown in FIG. 2C, the positive phase master output data signal P sent from the master latch circuit 6 is input to the gate of the NMOS transistor Ntr9, and an inverted phase slave output data signal QC is output from a drain connection point of the transistors Ptr13, Ntr8 and Ntr10 to the line L9. Also, in the other inverter not shown, the inverted phase master output data signal PC sent from the master latch circuit 6 is input to the gate of the NMOS transistor Ntr15, and a positive phase slave output data signal Q is output from a drain connection point of the transistors Ptr14, Ntr12 and Ntr14 to the line L8. Also, in the inverter shown in FIG. 2C, the positive phase slave output data signal Q set in the other inverter is input to the gates of the transistors Ptr13, Ntr8 and Ntr10. Also, in the other inverter not shown, the inverted phase slave output data signal QC set in the inverter of FIG. 2C is input to the gates of the transistors Ptr14, Ntr12 and Ntr14.

In cases where the positive phase slave output data signal Q input to the inverter shown in FIG. 2C is set to the high level, the off-state of the PMOS transistor Ptr13 and the on-state of the NMOS transistors Ntr8 and Ntr10 are obtained, and either the NMOS transistor Ntr9 receiving the positive phase master output data signal P or the NMOS transistor Ntr11 receiving the inverted phase master output data signal PC is set to the on-state. Therefore, the inverted phase slave output data signal QC is necessarily set to the low level regardless of the level of the positive phase master output data signal P. In the other inverter not shown, the on-state of the PMOS transistor Ptr14 and the off-state of the NMOS transistors Ntr12 and Ntr14 are obtained according to the inverted phase slave output data signal QC set to the low level. Therefore, the positive phase slave output data signal Q is necessarily set to the high level regardless of the level of the positive phase master output data signal P.

Also, in cases where the positive phase slave output data signal Q input to the inverter shown in FIG. 2C is set to the low level, the on-state of the PMOS transistor Ptr13 and the off-state of the NMOS transistors Ntr8 and Ntr10 are obtained. Therefore, the inverted phase slave output data signal QC is necessarily set to the high level regardless of the level of the positive phase master output data signal P. In the other inverter not shown, the off-state of the PMOS transistor Ptr14 and the on-state of the NMOS transistors Ntr12 and Ntr14 are obtained according to the inverted phase slave output data signal QC set to the high level, and either the NMOS transistor Ntr13 receiving the positive phase master output data signal P or the NMOS transistor Ntr15 receiving the inverted phase master output data signal PC is set to the on-state. Therefore, the positive phase slave output data signal Q is necessarily set to the low level regardless of the level of the positive phase master output data signal P.

Therefore, in the slave latch circuit 7, in case of the low level of the clock signal CLK1, the lines L6 and L7 of both the positive phase master output data signal P and the inverted phase master output data signal PC are isolated from the lines L8 and L9 of both the positive phase slave output data signal Q and the inverted phase slave output data signal QC. In this case, even though the levels of both the positive phase master output data signal P and the inverted phase master output data signal PC are changed, the level of each of both the positive phase slave output data signal Q and the inverted phase slave output data signal QC is not changed. Therefore, the slave latch circuit 7 is set to the data holding state, and the positive phase slave output data signal Q and the inverted phase slave output data signal QC set in the data through state just before the data holding state are held in the slave latch circuit 7.

The positive phase slave output data signal Q and the inverted phase slave output data signal QC held in the slave latch circuit 7 are inverted in the output driver 8 and are output from the master slave flip flop circuit as a positive phase output data signal Qout and an inverted phase output data signal Qcout.

Also, in cases where the clock signal CLK1 set to the low level is changed to the high level at a leading edge, the inverted phase clock signal CLK2 set to the low level is output from the clock input driver 1 to the circuit setting control unit 3. In the circuit setting control unit 3, the PMOS transistor Ptr3 is turned on by the inverted phase clock signal CLK2, and the NMOS transistor Ntr3 is turned off by the inverted phase clock signal CLK2. In this case, the first circuit state setting line 4 is electrically connected to the line L3 of the power source Vdd, and the second circuit state setting line L5 is electrically disconnected from the ground terminal GND. Therefore, because voltage Vdd of the power source is applied to the PMOS transistors Ptr6, Ptr7, Ptr8, Ptr9, Ptr12 and Ptr15, the PMOS transistors Ptr6, Ptr7, Ptr8, Ptr9, Ptr12 and Ptr15 can be set to an operation state. Also, because no electric potential of the ground is applied to each of the NMOS transistors Ntr4, Ntr7, Ntr10, Ntr11, Ntr12 and Ntr13, each of these NMOS transistors Ntr4, Ntr7, Ntr10, Ntr11, Ntr12 and Ntr13 has a high impedance.

In this case, as shown in FIG. 3A, an inverter (or a first inverter) having the transistors Ptr4, Ptr5, Ptr6, Ptr7 and Ntr5 is formed in the master latch circuit 6. Also, an inverter (or a second inverter) (not shown) having the transistors Ptr8, Ptr9, Ptr10, Ptr11 and Ntr6 is formed in the master latch circuit 6. In the inverter shown in FIG. 3A, the positive phase input data signal D sent from the data input driver 2 is input to the gate of the PMOS transistor Ptr4, the inverted phase input data signal DC sent from the data input driver 2 is input to the gate of the PMOS transistor Ptr6, and the inverted phase master output data signal PC is output from a drain connection point of the transistors Ptr5, Ptr7 and Ntr5 to the line L7. In the other inverter not shown, the inverted phase input data signal DC is input to the gate of the PMOS transistor Ptr10, the positive phase input data signal D is input to the gate of the PMOS transistor Ptr8, and the positive phase master output data signal P is output from a drain connection point of the transistors Ptr9, Ptr11 and Ntr6 to the line L6. Also, in the inverter shown in FIG. 3A, the positive phase master output data signal P set in the other inverter is input to the gates of the transistors Ptr5, Ptr7 and Ntr5. In the other inverter not shown, the inverted phase master output data signal PC set in the inverter of FIG. 3A is input to the gates of the transistors Ptr9, Ptr11 and Ntr6.

In cases where the positive phase master output data signal P input to the inverter shown in FIG. 3A is set to the high level, the off-state of the PMOS transistors Ptr5 and Ptr7 and the on-state of the NMOS transistor Ntr5 are obtained. Therefore, the inverted phase master output data signal PC is necessarily set to the low level regardless of the level of the positive phase input data signal D. In the other inverter not shown, the on-state of the PMOS transistors Ptr9 and Ptr11 and the off-state of the NMOS transistor Ntr6 are obtained according to the inverted phase input data signal DC set to the low level, and the PMOS transistor Ptr8 receiving the positive phase input data signal D or the PMOS transistor Ptr10 receiving the inverted phase input data signal DC is set to the on-state. Therefore, the positive phase master output data signal P is necessarily set to the high level regardless of the level of the positive phase input data signal D.

Also, in cases where the positive phase master output data signal P input to the inverter shown in FIG. 3A is set to the low level, the on-state of the PMOS transistors Ptr5 and Ptr7 and the off-state of the NMOS transistor Ntr5 are obtained, and either the PMOS transistor Ptr4 receiving the positive phase input data signal D or the PMOS transistor Ptr6 receiving the inverted phase input data signal DC is set to the on-state. Therefore, the inverted phase master output data signal PC is necessarily set to the high level regardless of the level of the positive phase input data signal D. In the other inverter not shown, the off-state of the PMOS transistors Ptr9 and Ptr11 and the on-state of the NMOS transistor Ntr6 are obtained according to the inverted phase master output data signal PC set to the high level. Therefore, the positive phase master output data signal P is necessarily set to the low level regardless of the level of the positive phase input data signal D.

Therefore, in the master latch circuit 6, in case of the high level of the clock signal CLK1, the lines L1 and L2 of both the positive phase input data signal D and the inverted phase input data signal DC are isolated from the lines L6 and L7 of both the positive phase master output data signal P and the inverted phase master output data signal PC. In this case, even though the levels of both the positive phase input data signal D and the inverted phase input data signal DC are changed, the level of each of both the positive phase master output data signal P and the inverted phase master output data signal PC is not changed. Therefore, the master latch circuit 6 is set to the data holding state, and both the positive phase master output data signal P and the inverted phase master output data signal PC set in the data through state just before the data holding state are held in the master latch circuit 6.

In contrast, as shown in FIG. 3B, an NAND gate (or a first NAND gate) NAND1 having the transistors Ptr12, Ptr13, Ntr8 and Ntr9 is formed in the slave latch circuit 7. Also, an NAND gate (or a second NAND gate) NAND2 having the transistors Ptr14, Ptr15, Ntr14 and Ntr15 is formed in the slave latch circuit 7. In this case, an output of the NAND gate NAND1 is input to the NAND gate NAND2, and an output of the NAND gate NAND2 is input to the NAND gate NAND1. Therefore, as shown in FIG. 3C, a RS flip-flop having both the NAND gate NAND1 and the NAND gate NAND2 is formed in the slave latch circuit 7. In this RS flip-flop, the positive phase master output data signal P sent from the master latch circuit 6 is input to the gates of the transistors Ptr12 and Ntr9 of the NAND gate NAND1 through the line L6 (refer to FIG. 3B), and the inverted phase master output data signal PC sent from the master latch circuit 6 is input to the gates of the transistors Ptr15 and Ntr15 of the NAND gate NAND2 through the line L7. Also, the inverted phase slave output data signal QC is output from a drain connection point of the transistors Ptr12, Ptr13 and Ntr8 of the NAND gate NAND1 to the line L9 (refer to FIG. 3B), and the positive phase slave output data signal Q is output from a drain connection point of the transistors Ptr14, Ptr15 and Ntr14 of the NAND gate NAND2 to the line L8. Also, the positive phase slave output data signal Q is fed back to the gates of the transistors Ptr13 and Ntr8 (refer to FIG. 3B), and the inverted phase slave output data signal QC is fed back to the gates of the transistors Ptr14 and Ntr14.

For example, when the positive phase master output data signal P is set to the low level, the inverted phase master output data signal PC is set to the high level. Therefore, in the NAND gate NAND1 shown in FIG. 3B, the NMOS transistor Ntr9 is turned off, the PMOS transistor Ptr12 is turned on, and the inverted phase slave output data signal QC set to the high level is output from the NAND gate NAND1 to the line L9. In the NAND gate NAND2, because of the inverted phase slave output data signal QC set to the high level and the inverted phase master output data signal PC set to the high level, the PMOS transistors Ptr14 and Ptr15 are turned off, and the NMOS transistors Ntr14 and Ntr15 are turned on. Therefore, the positive phase slave output data signal Q set to the low level is output from the NAND gate NAND2 to the line L8.

Also, though the NMOS transistor Ntr12 is turned on due to the inverted phase slave output data signal QC set to the high level in addition to the NMOS transistors Ntr14 and Ntr15, because the NMOS transistor Ntr13 is turned off due to the positive phase master output data signal P set to the low level, the NMOS transistor Ntr13 prevents that the ground electric potential is applied to the second circuit state setting line L5 through the NMOS transistors Ntr15, Ntr14, Ntr12 and Ntr13, and it is prevented that the master latch circuit 6 receives the ground electric potential of the second circuit state setting line L5. Therefore, the NMOS transistor Ntr13 functions as ground electric potential preventing means.

Also, when the positive phase master output data signal P is set to the high level, the inverted phase master output data signal PC is set to the low level. Therefore, in the NAND gate NAND2, because of the inverted phase master output data signal PC set to the low level, the NMOS transistor Ntr15 is turned off, and the PMOS transistor Ptr15 is turned on. Therefore, the positive phase slave output data signal Q set to the high level is output from the NAND gate NAND2 to the line L8. Also, in the NAND gate NAND1 shown in FIG. 3B, because of the positive phase slave output data signal Q set to the high level and the positive phase master output data signal P set to the high level, the NMOS transistors Ntr8 and Ntr9 are turned on, and the PMOS transistors Ptr12 and Ptr13 are turned off. Therefore, the inverted phase slave output data signal QC set to the low level is output from the NAND gate NAND1 to the line L9.

Also, though the NMOS transistor Ntr10 is turned on due to the positive phase slave output data signal Q set to the high level in addition to the NMOS transistors Ntr8 and Ntr9, because the NMOS transistor Ntr11 is turned off due to the inverted phase master output data signal PC set to the low level, the NMOS transistor Ntr11 prevents that the ground electric potential is applied to the second circuit state setting line L5 through the NMOS transistors Ntr9, Ntr8, Ntr10 and Ntr11, and it is prevented that the master latch circuit 6 receives the ground electric potential of the second circuit state setting line L5. Therefore, the NMOS transistor Ntr11 functions as ground electric potential preventing means.

Therefore, when the clock signal CLK1 set to the low level is changed to the high level, both the positive phase master output data signal P and the inverted phase master output data signal PC held in the master latch circuit 6 are received in the slave latch circuit 7 equivalent to the RS flip-flop and pass through the slave latch circuit 7, and the positive phase slave output data signal Q having the same phase as that of the positive phase master output data signal P is set in the line L8 of the slave latch circuit 7, and the inverted phase slave output data signal QC having the same phase as that of the inverted phase master output data signal PC is set in the line L9 of the slave latch circuit 7. That is, the slave latch circuit 7 is set to the data through state.

As is described above, when the clock signal CLK1 set to the high level is changed to the low level, the master latch circuit 6 is set to the data through state, the positive phase input data signal D and the inverted phase input data signal DC are received in the master latch circuit 6 and pass through the master latch circuit 6, both the positive phase master output data signal P set to the same level as that of the positive phase input data signal D and the inverted phase master output data signal PC set to the level different from that of the positive phase input data signal D are set in the master latch circuit 6. Thereafter, when the clock signal CLK1 set to the low level is changed to the high level, the master latch circuit 6 is set to the data holding state, and the slave latch circuit 7 is set to the data through state. In this case, in the master latch circuit 6, the level of each of both the positive phase master output data signal P and the inverted phase master output data signal PC set in the data through state just before the data holding state is not changed regardless of the level of the positive phase input data signal D, both the positive phase master output data signal P and the inverted phase master output data signal PC are held. In the slave latch circuit 7 set to the data through state, both the positive phase master output data signal P and the inverted phase master output data signal PC held in the master latch circuit 6 are received, both the positive phase slave output data signal Q set to the same level as that of the positive phase master output data signal P and the inverted phase slave output data signal QC set to the same level as that of the inverted phase master output data signal PC are set. Thereafter, when the clock signal CLK1 set to the high level is again changed to the low level, the slave latch circuit 6 is set to the data holding state, the level of each of both the positive phase slave output data signal Q and the inverted phase slave output data signal QC set in the data through state just before the data holding state is not changed in the slave latch circuit 7 regardless of the levels of both the positive phase master output data signal P and the inverted phase master output data signal PC set in the master latch circuit 6, and both the positive phase slave output data signal Q and the inverted phase slave output data signal QC are held in the slave latch circuit 7. Thereafter, when the clock signal CLK1 set to the low level is again changed to the high level, the positive phase slave output data signal Q and the inverted phase slave output data signal QC held in the slave latch circuit 7 are output to the output driver 8.

Therefore, because a new value of the positive phase input data signal D is loaded in the master slave flip-flop circuit when the clock signal CLK1 set to the low level is changed to the high level, the master slave flip-flop circuit functions as a positive edge trigger type flip-flop.

As is described above, in the first embodiment, the master slave flip-flop circuit includes the clock input driver 1 performing the waveform reshaping for the clock signal CLK1, the circuit setting control unit 3 performing the line connection and disconnection in synchronization with the clock signal CLK1, the master latch circuit 6 alternately set to the data through state and the data holding state according to the line connection and disconnection of the circuit setting control unit 3 and the slave latch circuit 7 alternately set to the data holding state and the data through state according to the line connection and disconnection of the circuit setting control unit 3. In the circuit setting control unit 3, the disconnection of the first circuit state setting line L4 from the line L3 set to the power source electric potential and the connection of the second circuit state setting line L5 to the ground terminal GND set to the ground electric potential are performed in synchronization with each first edge (for example, trailing edge) of the clock signal CLK1 to set the master latch circuit 6 to the data through state and to set the slave latch circuit 7 to the data holding state, and the connection of the first circuit state setting line L4 to the line L3 and the disconnection of the second circuit state setting line L5 from the ground terminal GND are performed in synchronization with each second edge (for example, leading edge) of the clock signal CLK1 to set the master latch circuit 6 to the data holding state and to set the slave latch circuit 7 to the data through state. In the master latch circuit 6 set to the data through state, a RS flip-flop is formed of the transistors connected to the line L3, the transistors connected to the second circuit state setting line L5 and the transistors connected to the ground terminal GND, data of the positive phase input data signal D and data of the inverted phase input data signal DC pass through the RS flip-flop, and data of the positive phase master output data signal P and data of the inverted phase master output data signal PC are set. Also, in the master latch circuit 6 set to the data holding state, a first inverter and a second inverter are formed of the transistors connected to the line L3, the transistors connected to the first circuit state setting line L4 and the transistors connected to the ground terminal GND, the inverted phase master output data signal PC set in the data through state is held in the first inverter regardless of both the positive phase input data signal D and the inverted phase input data signal DC, the positive phase master output data signal P set in the data through state is held in the second inverter regardless of both the positive phase input data signal D and the inverted phase input data signal DC. In the slave latch circuit 7 set to the data through state, a RS flip-flop is formed of the transistors connected to the line L3, the transistors connected to the first circuit state setting line L4 and the transistors connected to the ground terminal GND, data of the positive phase master output data signal P and data of the inverted phase master output data signal PC held in the master latch circuit 6 pass through the RS flip-flop, and data of the positive phase slave output data signal Q and data of the inverted phase slave output data signal QC are set. Also, in the slave latch circuit 7 set to the data holding state, a third inverter and a fourth inverter are formed of the transistors connected to the line L3, the transistors connected to the second circuit state setting line L5 and the transistors connected to the ground terminal GND, the inverted phase slave output data signal QC set in the data through state is held in the third inverter regardless of both the positive phase master output data signal P and the inverted phase master output data signal PC, the positive phase slave output data signal Q set in the data through state is held in the fourth inverter regardless of both the positive phase master output data signal P and the inverted phase master output data signal PC.

Accordingly, the number of transistors operated in synchronization with the clock signal CLK1 is reduced to four (transistors Ptr1, Ntr1, Ptr3 and Ntr3), an amount of both the charging current and the discharging current depending on parasitic capacitance based on the gate electrodes of the transistors of the master slave flip-flop circuit can be considerably reduced, and the electric power consumed in the master slave flip-flop circuit can be considerably reduced.

Also, the setting of the first circuit state setting line L4 to an electric potential of the power source Vdd through the PMOS transistors Ptr10, Ptr11, Ptr9 and Ptr8 is prevented by the PMOS transistor Ptr8 in case of both the clock signal CLK1 set to the low level and the positive phase input data signal D set to the high level. Also, the setting of the first circuit state setting line L4 to an electric potential of the power source Vdd through the PMOS transistors Ptr4, Ptr5, Ptr6 and Ptr7 is prevented by the PMOS transistor Ptr6 in case of both the clock signal CLK1 set to the low level and the positive phase input data signal D set to the low level. Accordingly, the PMOS transistor Ptr6 or Ptr8 can function as the power source electric potential preventing means, and it is prevented that the slave latch circuit 7 set to the data holding state receives the power source electric potential Vdd.

Also, the setting of the second circuit state setting line L5 to the ground electric potential through the NMOS transistors Ntr15, Ntr14, Ntr12 and Ntr13 is prevented by the NMOS transistor Ntr13 in case of both the clock signal CLK1 set to the high level and the positive phase input data signal D set to the low level. Also, the setting of the second circuit state setting line L5 to the ground electric potential through the NMOS transistors Ntr9, Ntr8, Ntr10 and Ntr11 is prevented by the NMOS transistor Ntr11 in case of both the clock signal CLK1 set to the high level and the positive phase input data signal D set to the high level. Accordingly, the NMOS transistor Ntr11 or Ntr13 can function as the ground electric potential preventing means, and it is prevented that the master latch circuit 6 set to the data holding state receives the ground electric potential.

In the first embodiment, the clock input driver 1 is arranged in the master slave flip-flop circuit to input a waveform-reshaped clock signal to the circuit setting control unit 3. However, in cases where the waveform of the clock signal CLK1 input to the master slave flip-flop circuit is sufficiently reshaped in the outside of the master slave flip-flop circuit, the clock input driver 1 is not required. In this case, the number of transistors operated in synchronization with the clock signal CLK1 is reduced to two.

Therefore, the electric power consumed in the master slave flip-flop circuit can be further reduced.

Embodiment 2

FIG. 4 is a constitutional view of a master slave flip-flop circuit according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 4, 11 indicates a master latch circuit composed of the PMOS transistors Ptr12 to Ptr15 and the NMOS transistors Ntr8 to Ntr15. 12 indicates a slave latch circuit composed of the PMOS transistors Ptr4 to Ptr11 and the NMOS transistors Ntr4 to Ntr7. The master latch circuit 11 has the same configuration as that of the slave latch circuit 7 of the first embodiment, and the slave latch circuit 12 has the same configuration as that of the master latch circuit 6 of the first embodiment. Therefore, as compared with the master slave flip-flop circuit of the first embodiment which functions as a positive edge trigger type flip-flop by loading a new value of the positive phase input data signal D when the clock signal CLK1 set to the low level is changed to the high level, the master slave flip-flop circuit of the second embodiment functions as a negative edge trigger type flip-flop by loading a new value of the positive phase input data signal D when the clock signal CLK1 set to the high level is changed to the low level.

In the master latch circuit 11, the positive phase input data signal D output from the data input driver 2 is input to the gates of the transistors Ptr12, Ntr9 and Ntr13, the inverted phase input data signal DC output from the data input driver 2 is input to the transistors Ptr15, Ntr11 and Ntr15, the positive phase master output data signal P is output from the drain connection point of the transistors Ptr14, Ptr15, Ntr12 and Ntr14, the positive phase master output data signal P is fed back to the gates of the transistors Ptr13 and Ntr8 and Ntr10, the inverted phase master output data signal PC is output from the drain connection point of the transistors Ptr12, Ptr13, Ntr8 and Ntr10, and the inverted phase master output data signal PC is fed back to the gates of the transistors Ptr14 and Ntr12 and Ntr14.

In the slave latch circuit 12, the positive phase master output data signal P output from the master latch circuit 11 is input to the gates of the transistors Ptr4, Ptr8 and Ntr4, the inverted phase master output data signal PC output from the master latch circuit 11 is input to the gates of the transistors Ptr6, Ptr10 and Ntr7, the positive phase slave output data signal Q is output from the drain connection point of the transistors Ptr9, Ptr11, Ntr6 and Ntr7, the positive phase slave output data signal Q is fed back to the gates of the transistors Ptr7 and Ntr5, the inverted phase slave output data signal QC is output from the drain connection point of the transistors Ptr5, Ptr7, Ntr4 and Ntr5, and the inverted phase slave output data signal QC is fed back to the gates of the transistors Ptr9 and Ntr6.

Therefore, when the clock signal CLK1 set to the low level is changed to the high level at a leading edge, the master latch circuit 11 is set to the data through state, and the slave latch circuit 12 is set to the data holding state. Also, when the clock signal CLK1 set to the high level is changed to the low level at a trailing edge, the master latch circuit 11 is set to the data holding state, and the slave latch circuit 12 is set to the data through state.

Also, when the clock signal CLK1 set to the high level and the positive phase input data signal D set to the low level are input to the master slave flip-flop circuit, the setting of the second circuit state setting line L5 to the ground electric potential through the NMOS transistors Ntr15, Ntr14, Ntr12 and Ntr13 is prevented by the NMOS transistor Ntr13. Also, when the clock signal CLK1 set to the high level and the positive phase input data signal D set to the high level are input to the master slave flip-flop circuit, the setting of the second circuit state setting line L5 to the ground electric potential through the NMOS transistors Ntr9, Ntr8, Ntr10 and Ntr11 is prevented by the NMOS transistor Ntr11. Also, when the clock signal CLK1 set to the low level and the positive phase input data signal D set to the high level are input to the master slave flip-flop circuit, the setting of the first circuit state setting line L4 to an electric potential of the power source Vdd through the PMOS transistors Ptr10, Ptr11, Ptr9 and Ptr8 is prevented by the PMOS transistor Ptr8. Also, when the clock signal CLK1 set to the low level and the positive phase input data signal D set to the low level are input to the master slave flip-flop circuit, the setting of the first circuit state setting line L4 to an electric potential of the power source Vdd through the PMOS transistors Ptr4, Ptr5, Ptr6 and Ptr7 is prevented by the PMOS transistor Ptr6.

As is described above, in the second embodiment, the master latch circuit 11 has the same configuration as that of the slave latch circuit 7 of the first embodiment, and the slave latch circuit 12 has the same configuration as that of the master latch circuit 6 of the first embodiment. Therefore, a new value of the positive phase input data signal D is loaded in the master slave flip-flop circuit when the clock signal CLK1 set to the high level is changed to the low level, and the master slave flip-flop circuit functions as a negative edge trigger type flip-flop. Accordingly, the number of transistors operated in synchronization with the clock signal CLK1 is reduced to four (transistors Ptr1, Ntr1, Ptr3 and Ntr3) in the same manner as in the first embodiment, an amount of both the charging current and the discharging current depending on parasitic capacitance based on the gate electrodes of the transistors of the master slave flip-flop circuit can be considerably reduced, and the electric power consumed in the master slave flip-flop circuit can be considerably reduced.

Also, the PMOS transistor Ptr6 or Ptr8 can function as the power source electric potential preventing means of the slave latch circuit 12, and it is prevented that the master latch circuit 11 set to the data holding state receives the power source electric potential Vdd. Also, the NMOS transistor Ntr11 or Ntr13 can function as the ground electric potential preventing means of the master latch circuit 11, and it is prevented that the slave latch circuit 12 set to the data holding state receives the ground electric potential.

Embodiment 3

Figure 5:
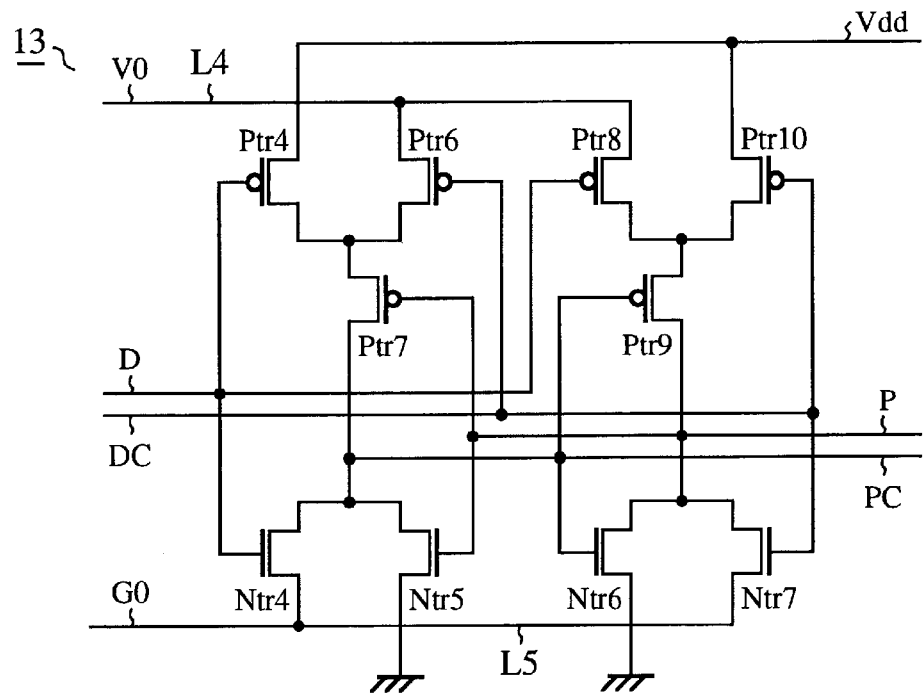
FIG. 5 is a constitutional view of a master latch circuit of a master slave flip-flop circuit according to a third embodiment of the present invention.
Figure 6:
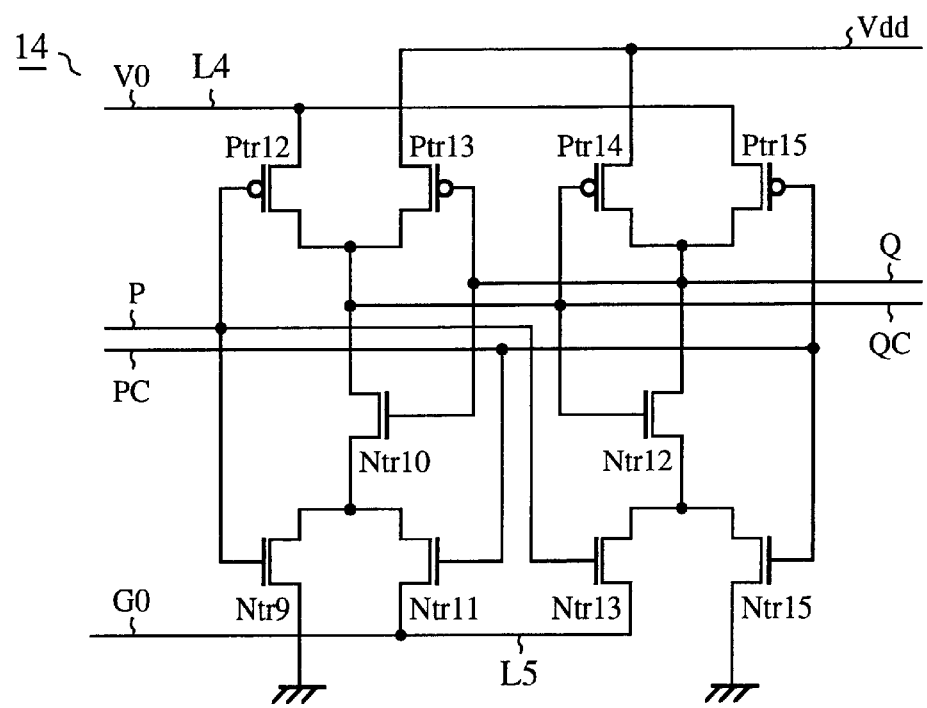
FIG. 6 is a constitutional view of a slave latch circuit of the master slave flip-flop circuit according to the third embodiment of the present invention.
Figure 7:
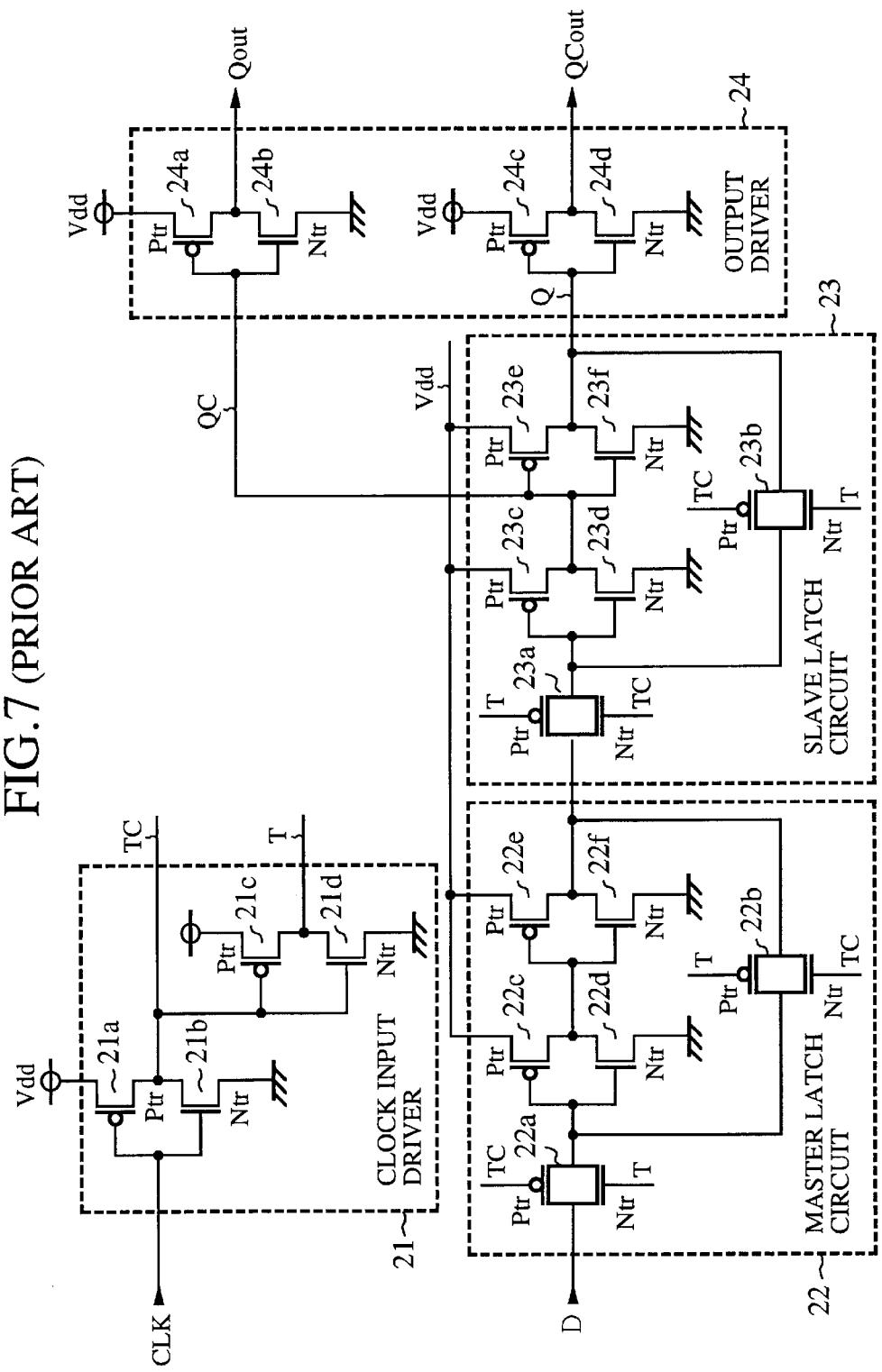
FIG. 7 is a constitutional view of a conventional master slave flip-flop circuit.

FIG. 5 is a constitutional view of a master latch circuit of a master slave flip-flop circuit according to a third embodiment of the present invention, and FIG. 6 is a constitutional view of a slave latch circuit of the master slave flip-flop circuit according to the third embodiment of the present invention. The constituent elements, which are the same as those shown in FIG. 1, are indicated by the same reference numerals as those of the constituent elements shown in FIG. 1, and additional description of those constituent elements is omitted.

In FIG. 5, 13 indicates a master latch circuit. As compared with master latch circuit 6 of the first embodiment, the PMOS transistors Ptr5 and Ptr11 are removed from the master latch circuit 13, the drain connection point of the PMOS transistors Ptr4 and Ptr6 are connected to the source of the PMOS transistor Ptr7, and the drain connection point of the PMOS transistors Ptr8 and Ptr10 are connected to the source of the PMOS transistor Ptr9. In the first embodiment, the gates of the PMOS transistors Ptr5 and Ptr7 are connected to each other, and the drains of the PMOS transistors Ptr5 and Ptr7 are connected to each other. Also, in the third embodiment, the drains of the PMOS transistors Ptr4 and Ptr6 are connected to the source of the PMOS transistor Ptr7 in place of the sources of the PMOS transistors Ptr5 and Ptr7. Therefore, in the third embodiment, the PMOS transistor Ptr7 can be operated in the same manner as the PMOS transistors Ptr5 and Ptr7 of the first embodiment. Also, in the same manner, the PMOS transistor Ptr9 can be operated in the same manner as the PMOS transistors Ptr9 and Ptr11 of the first embodiment.

In cases where the first circuit state setting line 4 is electrically disconnected from the line L3 of the power source Vdd by the function of the circuit setting control unit 3, no voltage is applied to each of the PMOS transistors Ptr6 and Ptr8, and each of the PMOS transistors Ptr6 and Ptr8 has a high impedance. Therefore, the master latch circuit 13 set to the data through state is operated in the same manner as the master latch circuit 6 set to the data through state. Also, in cases where the first circuit state setting line 4 is electrically connected to the line L3 of the power source Vdd by the function of the circuit setting control unit 3, the group of PMOS transistors Ptr4, Ptr6 and Ptr7 are operated in the same manner as the group of PMOS transistors Ptr4 to Ptr7 of the first embodiment, and the group of PMOS transistors Ptr8, Ptr9 and Ptr10 are operated in the same manner as the group of PMOS transistors Ptr8 to Ptr10 of the first embodiment. Therefore, the master latch circuit 13 set to the data holding state is operated in the same manner as the master latch circuit 6 set to the data holding state.

In FIG. 6, 14 indicates a slave latch circuit. As compared with the slave latch circuit 7 of the first embodiment, the NMOS transistors Ntr8 and Ntr14 are removed from the slave latch circuit 14, the drain connection point of the NMOS transistors Ntr9 and Ntr11 are connected to the source of the NMOS transistor Ntr10, and the drain connection point of the NMOS transistors Ntr13 and Ntr15 are connected to the source of the NMOS transistor Ntr12. In the first embodiment, the gates of the NMOS transistors Ntr8 and Ntr10 are connected to each other, and the drains of the NMOS transistors Ntr8 and Ntr10 are connected to each other. Also, in the third embodiment, the drains of the NMOS transistors Ntr8 and Ntr10 are connected to the source of the NMOS transistor Ntr10 in place of the sources of the NMOS transistors Ntr8 and Ntr10. Therefore, in the third embodiment, the NMOS transistor Ntr10 can be operated in the same manner as the NMOS transistors Ntr8 and Ntr10 of the first embodiment. Also, in the same manner, the NMOS transistor Ntr12 can be operated in the same manner as the NMOS transistors Ntr12 and Ntr14 of the first embodiment.

In cases where the second circuit state setting line 5 is electrically disconnected from the ground terminal GND by the function of the circuit setting control unit 3, no voltage is applied to each of the PMOS transistors Ntr11 and Ntr13, and each of the PMOS transistors Ntr11 and Ntr13 has a high impedance. Therefore, the slave latch circuit 14 set to the data through state is operated in the same manner as the slave latch circuit 7 set to the data through state. Also, in cases where the second circuit state setting line 5 is electrically connected to the ground terminal GND by the function of the circuit setting control unit 3, the group of NMOS transistors Ntr9, Ntr10 and Ntr11 are operated in the same manner as the group of PMOS transistors Ntr8 to Ntr11 of the first embodiment, and the group of NMOS transistors Ntr12, Ntr13 and Ntr15 are operated in the same manner as the group of NMOS transistors Ntr12 to Ntr15 of the first embodiment. Therefore, the slave latch circuit 14 set to the data holding state is operated in the same manner as the slave latch circuit 7 set to the data holding state.

In the third embodiment, the master latch circuit 13 and the slave latch circuit 14 operated in the same manner as in the first embodiment are obtained by modifying the master latch circuit 6 and the slave latch circuit 7 of the first embodiment. However, it is applicable that a master latch circuit and a slave latch circuit operated in the same manner as in the second embodiment be obtained by modifying the master latch circuit 11 and the slave latch circuit 12 of the second embodiment.

As is described above, in the third embodiment, the number of transistors used for both the master latch circuit 13 and the slave latch circuit 14 can be reduced as compared with that in the first or second embodiment. Accordingly, the configuration of the master slave flip-flop circuit can be simplified, and the manufacturing cost of the master slave flip-flop circuit can be reduced.

Also, because the number of transistors operated in synchronization with the input data signal D is reduced, electric power consumed in the master slave flip-flop circuit can be further reduced.

What is claimed is:

1. A master slave flip-flop circuit comprising:
   a master latch circuit for receiving input data in a data through state and holding the input data as master output data in a data holding state;
   a slave latch circuit for receiving the master output data held by the master latch circuit in a data through state, holding the master output data as slave output data in a data holding state, and outputting the slave output data; and
   circuit state setting control means for performing both the disconnection of a first line connected to both the master latch circuit and the slave latch circuit from a line set to a first electric potential and the connection of a second line connected to both the master latch circuit and the slave latch circuit to a line set to a second electric potential in response to a first level of a clock signal to set the master latch circuit to the data through state and to set the slave latch circuit to the data holding state and performing both the connection of the first line to the line set to the first electric potential and the disconnection of the second line from the line set to the second electric potential in response to a second level of the clock signal to set the master latch circuit to the data holding state and to set the slave latch circuit to the data through state.

2. The master slave flip-flop circuit according to claim 1, wherein the first electric potential denotes a power source electric potential, and the second electric potential denotes a ground electric potential lower than the power source electric potential.

3. The master slave flip-flop circuit according to claim 2, wherein the master latch circuit is set in the data through state using a RS flip-flop circuit composed of both a first NOR gate and a second NOR gate so as to input both the input data and the master output data output from the second NOR gate to the first NOR gate and to input inverted input data and inverted master output data output from the first NOR gate to the second NOR gate, the master latch circuit is set in the data holding state to a circuit composed of a first inverter and a second inverter so as to hold the inverted master output data set in the data through state in the first inverter regardless of the input data and to hold the master output data set in the data through state in the second inverter regardless of the input data, the slave latch circuit is set in the data through state using a RS flip-flop circuit composed of both a first NAND gate and a second NAND gate so as to input both the master output data and the slave output data output from the second NAND gate to the first NAND gate and to input both inverted master output data and inverted slave output data output from the first NAND gate to the second NAND gate, and the slave latch circuit is set in the data holding state to a circuit composed of a third inverter and a fourth inverter so as to hold the inverted slave output data set in the data through state in the first inverter regardless of the master output data and to hold the slave output data set in the data through state in the second inverter regardless of the master output data.

4. The master slave flip-flop circuit according to claim 2, wherein the master latch circuit comprises power source electric potential preventing means for preventing that the power source electric potential is applied to the slave latch circuit in a case of the data through state of the master latch circuit, and the slave latch circuit comprises ground electric potential preventing means for preventing that the ground electric potential is applied to the master latch circuit in a case of the data through state of the slave latch circuit.

5. The master slave flip-flop circuit according to claim 1, wherein the second electric potential denotes a power source electric potential, and the first electric potential denotes a ground electric potential lower than the power source electric potential.

6. The master slave flip-flop circuit according to claim 5, wherein the master latch circuit is set in the data through state using a RS flip-flop circuit composed of both a first NAND gate and a second NAND gate so as to input both the input data and the master output data output from the second NAND gate to the first NAND gate and to input inverted input data and inverted master output data output from the first NAND gate to the second NAND gate, the master latch circuit is set in the data holding state to a circuit composed of a first inverter and a second inverter so as to hold the inverted master output data set in the data through state in the first inverter regardless of the input data and to hold the master output data set in the data through state in the second inverter regardless of the input data, the slave latch circuit is set in the data through state using a RS flip-flop circuit composed of both a first NOR gate and a second NOR gate so as to input both the master output data and the slave output data output from the second NOR gate to the first NOR gate and to input both inverted master output data and inverted slave output data output from the first NOR gate to the second NOR gate, and the slave latch circuit is set in the data holding state to a circuit composed of a third inverter and a fourth inverter so as to hold the inverted slave output data set in the data through state in the first inverter regardless of the master output data and to hold the slave output data set in the data through state in the second inverter regardless of the master output data.

7. The master slave flip-flop circuit according to claim 5, wherein the master latch circuit comprises ground electric potential preventing means for preventing that the ground electric potential is applied to the slave latch circuit in a case of the data through state of the master latch circuit, and the slave latch circuit comprises power source electric potential preventing means for preventing that the power source electric potential is applied to the master latch circuit in a case of the data through state of the slave latch circuit.

8. The master slave flip-flop circuit according to claim 1, wherein the circuit state setting control means comprises a first transistor for connecting or disconnecting the first line to or from the line set to the first electric potential in response to the clock signal, and a second transistor for connecting or disconnecting the second line to or from the line set to the second electric potential in response to the clock signal.

* * * * *